United States Patent
Kim et al.

(10) Patent No.: US 9,622,342 B2
(45) Date of Patent: Apr. 11, 2017

(54) DISPLAY APPARATUS (71) Applicant: SAMSUNG DISPLAY CO., LTD., Yongin, Gyeonggi-Do (KR)

(72) Inventors: Yang-Wan Kim, Yongin (KR); Won-Kyu Kwak, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 314 days.

(21) Appl. No.: 14/335,710

(22) Filed: Jul. 18, 2014

(65) Prior Publication Data
US 2015/0201492 A1 Jul. 16, 2015

(30) Foreign Application Priority Data
Jan. 16, 2014 (KR) ........................ 10-2014-0005603

(51) Int. Cl.
*H05K 1/00* (2006.01)
*H05K 1/02* (2006.01)
(Continued)

(52) U.S. Cl.
CPC ............ *H05K 1/028* (2013.01); *H05K 1/118* (2013.01); *H05K 3/361* (2013.01); *H05K 1/0277* (2013.01); *H05K 1/0283* (2013.01); *H05K 1/147* (2013.01); *H05K 1/189* (2013.01); *H05K 2201/05* (2013.01); *H05K 2201/055* (2013.01); *H05K 2201/09027* (2013.01); *H05K 2201/09418* (2013.01); *H05K 2201/10128* (2013.01); *H05K 2201/10681* (2013.01)

(58) Field of Classification Search
CPC ..... H05K 2201/05; H05K 2201/10681; H05K 1/0277; H05K 1/028; H05K 1/0283; H05K 1/147; H05K 1/189; H01L 2224/50; H01L 2224/79; H01L 2225/107; G02F 1/13458; G02F 2001/13456; G09G 2290/00
USPC .................................. 361/749; 349/149–152
See application file for complete search history.

(56) References Cited

U.S. PATENT DOCUMENTS 6,472,820 B1 * 10/2002 Mo .......................... H01J 5/46
                                                            313/581
2004/0170087 A1 * 9/2004 Shimizu ................ G04G 17/06
                                                            368/10
(Continued)

FOREIGN PATENT DOCUMENTS

JP   2005-243968 A   9/2005
JP   2007-165412 A   6/2007
(Continued)

*Primary Examiner* — Binh Tran
(74) *Attorney, Agent, or Firm* — Lewis Roca Rothgerber Christie LLP (57) ABSTRACT

Provided is a display apparatus. The display apparatus includes a display panel including a substrate including a display region in which a display unit is located, a non-display region that extends outward from the display region and in which a plurality of pads are located, and a sealing portion that covers the display unit. The display apparatus also includes a circuit board including a flexible film and a plurality of terminals on the flexible film that are electrically coupled to the plurality of pads. The plurality of pads are spaced from each other along a first direction of the display panel and pad central points of the plurality of pads are located at at least two different locations along the first direction.

17 Claims, 10 Drawing Sheets

(51) Int. Cl.
    *H05K 1/11*    (2006.01)
    *H05K 3/36*    (2006.01)
    *G02F 1/1345*    (2006.01)
    *H05K 1/18*    (2006.01)
    *H05K 1/14*    (2006.01)

(56) References Cited

U.S. PATENT DOCUMENTS

| | | | | |
|---|---|---|---|---|
| 2008/0253074 | A1* | 10/2008 | Shie | H05K 3/361 |
| | | | | 361/679.02 |
| 2011/0221688 | A1* | 9/2011 | Byun | H04B 1/385 |
| | | | | 345/173 |

FOREIGN PATENT DOCUMENTS

| | | |
|---|---|---|
| KR | 10-2005-0064861 | 6/2005 |
| KR | 10-2006-0042489 | 5/2006 |
| KR | 10-2008-0008617 | 1/2008 |
| KR | 10-2010-0023739 | 3/2010 |

\* cited by examiner

DISPLAY APPARATUS

CROSS-REFERENCE TO RELATED APPLICATION

This application claims priority to and the benefit of Korean Patent Application No. 10-2014-0005603, filed on Jan. 16, 2014, in the Korean Intellectual Property Office, the disclosure of which is incorporated herein in its entirety by reference.

BACKGROUND

1. Field

One or more embodiments of the present invention relate to a display apparatus that is configured to facilitate an easy connection between a pad and a circuit board.

2. Description of the Related Art

Conventionally, an organic light emitting display apparatus (OLED) including thin film transistors (TFTs) is used in a display apparatus for a mobile device, such as a smart phone, a digital camera, a personal digital assistant (PDA), an ultrathin notebook computer, a tablet personal computer, or in a digital electronic device, such as an ultrathin television.

An OLED includes a first electrode, a second electrode, and an intermediate layer disposed between the first electrode and the second electrode. The OLED has advantages such as a wide viewing angle, excellent contrast, and fast response time.

Conventionally, a display apparatus such as an OLED includes a plurality of pads on one side of a display panel. The pads are electrically coupled to a circuit board. A space for connecting the pads to the circuit board should be secured. Additionally, a simple connection between the pads and the circuit board should be established.

SUMMARY

One or more embodiments of the present invention include display apparatuses in which pads formed on display panels and terminals of circuit boards formed on display panels may be easily coupled to each other.

Additional aspects will be set forth in part in the description which follows and, in part, will be apparent from the description, or may be learned by practice of the present embodiments.

According to one or more embodiments of the present invention, a display apparatus includes a display panel including a substrate including a display region in which a display unit is located, a non-display region that extends outward from the display region and in which a plurality of pads are located, and a sealing portion that covers the display unit. The display apparatus also includes a circuit board including a flexible film and a plurality of terminals on the flexible film that are electrically coupled to the plurality of pads. The plurality of pads are spaced from each other along a first direction of the display panel and pad central points of the plurality of pads are at at least two different locations along the first direction.

In an embodiment, at least a portion of the display panel may be curved.

In an embodiment, the display panel may have a circular shape.

In an embodiment, the pads may be spaced from each other along an arc direction of the display panel, and the pad central points may be at at least two different locations along the arc direction.

In an embodiment, a line extending through the pad central point of each pad may divide a length of the pad into two.

In an embodiment, the plurality of pads may be arranged along an external profile of the display region, and a terminal of the circuit board coupled to the pads may have a shape corresponding to a shape of the plurality of pads.

In an embodiment, a radius of curvature defined by the plurality of pads may be the same as a radius of curvature defined by the display region.

In an embodiment, angles between adjacent ones of the pads may be the same.

In an embodiment, lengths of arcs between adjacent ones of the pads may be the same.

In an embodiment, an angle between adjacent ones of the terminals may be the same as an angle between adjacent ones of the pads.

In an embodiment, an arc length between adjacent ones of the terminals may be the same as an arc length between adjacent ones of the pads.

In an embodiment, an edge of the flexible film may have a curvature corresponding to an external profile of the display region.

In an embodiment, angles between adjacent ones of the pads may vary across the plurality of pads.

In an embodiment, an angle between adjacent pads may increase from a center of the pads to a periphery of the pads.

In an embodiment, an arc length between adjacent pads of the plurality of pads may increase from the center of the pads to the periphery of the pads.

In an embodiment, each pad central may correspond to a center of a region at which the pads and the terminals are coupled to each other.

In an embodiment, the flexible film may be folded around a portion of the substrate and a plurality of slits may be defined along a portion of the flexible film at which the flexible film is folded.

In an embodiment, the slits may be spaced from each other along a direction transverse to a direction in which the flexible film is folded.

In an embodiment, the plurality of pads may include at least one first pad arranged along the first direction of the display panel and at least one second pad at an outermost portion of the plurality of pads. A size of the second pad may be greater than a size of the first pad.

In an embodiment, the first pad and the second pad may be spaced from each other along the first direction of the display panel and a central point of the first pad and a central point of the second pad may be at different locations along the first direction.

In an embodiment, the first pad may be configured to display an image of the display unit and the second pad may be configured to turn the display panel on or off.

In an embodiment, the plurality of pads may include a first pad arranged along the first direction of the display panel, and a second pad at a different line from the first pad. The first pad and the second pad may be arranged in an alternating manner.

In an embodiment, the first pad may be arranged along a first line of the first direction, the second pad may be arranged along a second line of the first direction, and a first pad central point and a second pad central point may be at different locations along the first direction.

In an embodiment, at least a portion of the substrate may be exposed beyond a periphery of the sealing portion. The exposed portion corresponds to the non-display region in which the pads are located.

In an embodiment, the display unit may include a thin film transistor and an organic light-emitting device including an intermediate layer electrically coupled to the thin-film transistor and an emitting layer between the first electrode and the second electrode.

This summary is provided to introduce a selection of concepts that are further described below in the detailed description. This summary is not intended to identify key or essential features of the claimed subject matter, nor is it intended to be used in limiting the scope of the claimed subject matter.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

As the invention allows for various changes and numerous embodiments, particular embodiments will be illustrated in the drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention. In the description of the present invention, certain detailed explanations of the related art are omitted when it is deemed that they may unnecessarily obscure the essence of the invention.

It will be understood that although the terms "first", "second", etc. may be used herein to describe various components, these components should not be limited by these terms. These components are only used to distinguish one component from another.

As used herein, the singular forms "a," "an" and "the" are intended to include the plural forms as well, unless the context clearly indicates otherwise. It will be further understood that the terms "comprises" and/or "comprising" used herein specify the presence of stated properties, numbers, processes, operations, features, components, or a combination thereof, but do not preclude the presence or addition of one or more other features or components.

Figure 1:
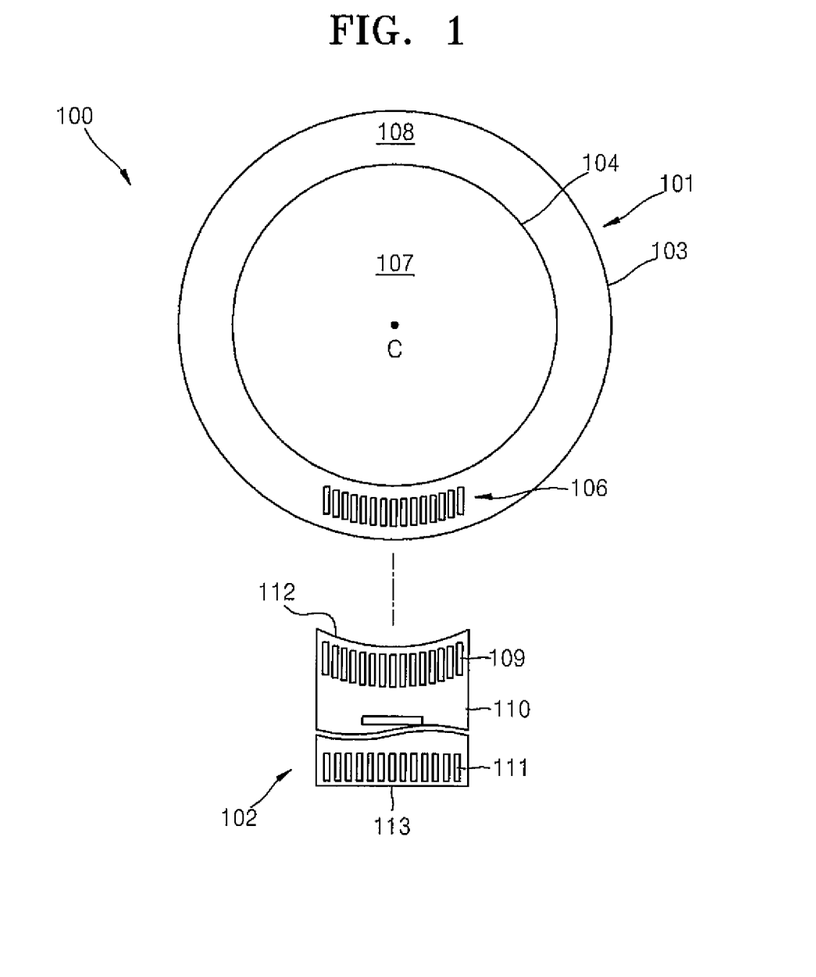
FIG. 1 is a plan view of a pad and a terminal of a circuit board of a display apparatus according to an embodiment of the present invention, before coupling the same.
Figure 2:
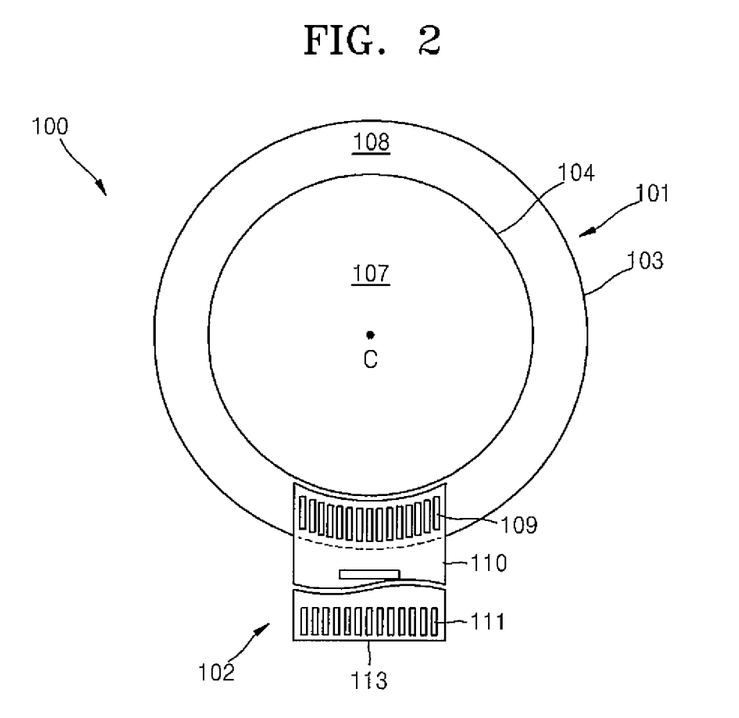
FIG. 2 is a plan view of a pad and a terminal of a circuit board of the display apparatus in FIG. 1, after coupling the same.
Figure 3:
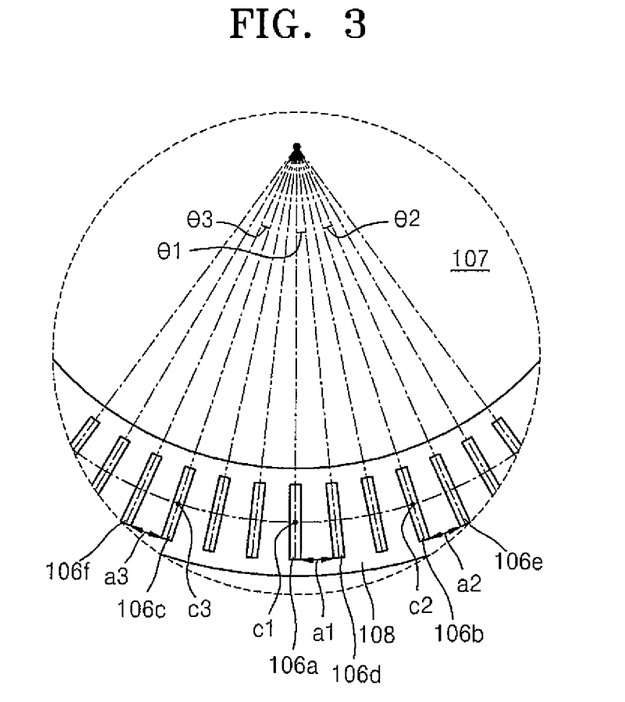
FIG. 3 is an enlarged plan view showing a portion in which a pad is formed in the display apparatus of FIG. 1.

FIG. 1 illustrates a pad 106 and a first terminal 109 of a circuit board 102 of a display apparatus 100 according to an embodiment of the present invention, before coupling the same. FIG. 2 illustrates the pad 106 and the first terminal 109 of the circuit board 102 of the display apparatus 100 in FIG. 1, after coupling the same. FIG. 3 illustrates an enlarged view of a portion of the display apparatus 100 in FIG. 1 in which the pad 106 is formed.

According to the present embodiments, the display apparatus 100 refers to an organic light-emitting device (OLED), but the display apparatus 100 may be any display apparatus that displays an image after applying power.

Referring to FIGS. 1 to 3, the display apparatus 100 includes a display panel 101 and a circuit board 102.

A substrate 103 is provided in the display panel 101. The substrate 103 includes a display region 107 in which a display unit (105 in FIG. 10) is formed and a non-display region 108 that extends outwards from the display region 107 (e.g., the non-display region 108 extends around a periphery of the display region 107 of the substrate 103).

The display region 107 includes the display unit 105, such as an OLED, which may display an image when power is applied thereto. The non-display region 108 includes a plurality of pads 106 that is electrically coupled to devices in the display unit 105. The substrate 103 also includes a sealing portion 104 that covers the display unit 105. The sealing portion 104 is sized to cover the display region 107.

The pad 106 is electrically coupled to the circuit board 102 to receive external signals. The circuit board 102 may be a flexible printed circuit board (FPCB).

At least a portion of the display panel 101 may be curved. According to an embodiment of the present invention, the display panel 101 has a circular shape.

In one embodiment, the substrate 103 has a circular shape. The display region 107 formed on the substrate 103 may also have a circular shape. Furthermore, the non-display region 108 that extends around or outward from the display region 107 may also have a circular shape. The substrate 103, the display region 107, and the non-display region 108 may substantially have the same radius of curvature.

In one embodiment, the pads 106 are spaced from each other along a first direction of the display panel 101. Central points of the pads 106 are located at at least two different locations along the first direction of the display panel 101 (e.g., the central points of the pads 106 are each defined along a second direction that crosses (or intersects) the first direction).

In greater detail, embodiments of the present invention may be described as follows.

The display region 107 has a circular shape. The non-display region 108 has the same radius of curvature as the display region 107 and has a circular shape. According to embodiments of the present invention, each of the display region 107 and the non-display region 108 has a circular shape; however, the display panel 101, the substrate 103, the display region 107, and the non-display region 108 may have any other suitable shape, such as semi-circular, oval, rectangular, wavy shape, or the like.

The pads 106 are located on the non-display region 108. The pads 106 are spaced from each other on the non-display region 108. Each of the plurality of pads 106 has a rectangular shape and the same size. According to one embodiment, each of the plurality of pads 106 has the same size and shape, but the pads 106 may have different sizes and shapes depending on the desired or intended use.

The plurality of pads 106 is aligned along an arc direction, which defines the first direction of the display panel 101. The central points of the pads 106 are formed on at least two different locations along the first direction of the display panel 101 (e.g., the central points of the pads 106 are defined at at least two different intersections between the arc direction and radial lines or directions extending outward from a central point C of the display panel 101).

For example, a first pad 106a, which is located at the center of the plurality of pads 106, includes a first pad central point $c_1$. The first pad central point $c_1$ is located along a direction (e.g., a radial direction) that crosses or intersects the first direction. The direction along which the first pad central point c1 is located divides a length of the first pad 106a into two (e.g., the first pad 106a is symmetric about the radial direction along which the first pad central point $c_1$ is located).

Among the plurality of pads 106, a second pad 106b is located at the right side of the first pad 106a. The second pad 106b includes a second pad central point $c_2$ located along a direction (e.g., a radial direction) that crosses the first direction. The direction along which the second pad central point $c_2$ is located divides a length of the second pad 106c into two (e.g., the second pad 106b is symmetric about the radial direction along which the second pad central point $c_2$ is located).

Among the plurality of pads 106, a third pad 106c is located at the left side of the first pad 106a. The third pad 106c includes a third pad central point c3 located along a direction (e.g., a radial direction) that crosses the first direction. The direction along which the third pad central point $c_3$ is located divides a length of the third pad 106c into two (e.g., the third pad 106c is symmetric about the radial direction along which the third pad central point $c_3$ is located).

The first pad central point $c_1$, the second pad central point $c_2$, and the third pad central point $c_3$ are defined at different locations along the arc direction. The first pad central point $c_1$, the second pad central point $c_2$, and the third pad central point $c_3$ are located at different locations because the pads 106 are arranged along the arc direction. Central points of pads 106 other than the first pad central point $c_1$, the second pad central point $c_2$, and the third pad central point $c_3$ may have different locations.

Furthermore, in one embodiment, the pads 106 are arranged along an external profile of the display region 107. A radius of curvature of the plurality of pads 106 is substantially the same as the radius of curvature of the display region 107.

The pads 106 are arranged such that the pads 106 each define an angle θ relative to a central point C of the display panel 101.

For example, the first pad 106a, which is located at the center of the plurality of pads 106, and a fourth pad 106d, which is located next to the first pad 106a, define a first angle $\theta_1$ therebetween relative to the central point C of the display panel 101. A length of a space between the first pad 106a and the fourth pad 106d is a first arc length $a_1$.

The second pad 106b, which is located on the right side of the first pad 106a, and a fifth pad 106e, which is located next to the second pad 106c, define a second angle $\theta_2$ therebetween relative to the central point C of the display panel 101. A length of a space between the second pad 106b and the fifth pad 106e is a second arc length $a_2$.

The third pad 106c, which is disposed on the left side of the first pad 106a, and a sixth pad 106f, which is disposed next to the third pad 106c, define a third angle $\theta_3$ therebetween relative to the central point C of the display panel 101. A length of a space between the third pad 106c and the sixth pad 106f is a third arc length $a_3$.

In one embodiment, the first angle $\theta_1$, the second angle θ2, and the third angle $\theta_3$ are the same. Also, the first arc length $a_1$, the second arc length $a_2$, and the third arc length $a_3$ are the same.

Accordingly, in one embodiment, the pads 106 are located such that the same angle relative to the central point C is defined between adjacent pads 106. Also, the same arc length is defined between adjacent pads 106.

As described above, the pads 106 are spaced along the first direction, which is an arc direction of the display panel 101. Central points of the pads 106 are arranged at different locations along the arc direction of the display panel 101 (e.g., central points of the pads 106 are defined at intersections between the arc direction and radial directions extending outward from the central point C of the display panel 101). The pads 106 are arranged along the external profile of the display region 107.

When the display panel 101 is manufactured in a circular shape, as illustrated in FIG. 3, the central points of the pads 106 may be positioned at different locations along a vertical direction of FIG. 3 (e.g., the central points of the pads 106 may be located along an arc). Positioning the central points of the pads 106 at different vertical locations enables the plurality of pads 106 to occupy a smaller space compared to a conventional display panel in which the plurality of pads 106 are arranged along a straight line in the horizontal direction (e.g., locating the central points of the pads 106 at different vertical locations permits the pads 106 to occupy a smaller space compared to pads having central points that are all located at the same vertical position).

This space saving occurs because a size of a total space of the pads 106 is smaller when the central points of the pads 106 are located at different vertical locations than when the central points of the pads 106 are located at the same vertical location.

A first terminal 109 of the circuit board 102 is electrically coupled to the pad 106. The circuit board 102 may be a FPCB. The central point of each pad 106 may correspond to the center of a portion of the pads 106 that is coupled to the first terminal 109 of the circuit board 102.

The circuit board 102 includes a flexible film 110. The first terminals 109 that are coupled to the pads 106 are located on a first periphery or side 112 of the flexible film 110. A plurality of second terminals 111 that is configured to be coupled to an external device is located on a second periphery or side 113 of the flexible film 110 opposite the first terminals 109.

In one embodiment, the first terminal 109 of the circuit board 102 is shaped to correspond to the pads 106. The number of the first terminals 109 is at least as many as the number of the pads 106. The first terminals 109 are aligned on the first periphery or side 112 of the flexible film 110. The first terminals 109 have the same shape as the pads 106 to facilitate a good connection between the first terminals 109 and the pads 106. According to the present embodiment, the first terminals 109 each have a rectangular shape.

When the first terminals 109 are coupled to the pads 106, the first terminals 109 extend along or around at least a portion of the external profile of the display region 107. A curvature of the first terminals 109 is substantially the same as a curvature of the pads 106. The first terminals 109 are electrically coupled to the pads 106 by aligning the first terminals 109 with the pads 106. The first terminals 109 may be electrically coupled to the pads 106 with a conductive element.

When the first terminals 109 are coupled to the pads 106, the first terminals 109 are spaced apart from each other and arranged along the arc direction, which is the first direction of the display panel 101. Central points of the first terminals 109 are formed on at least two different locations along the arc direction of the display panel 101 (e.g., central points of the first terminals 109 are defined at intersections between the arc direction and radial directions extending outward from the central point C of the display panel 101).

The first terminals 109 are arranged at the same angular positions as the pads 106 relative to the central point C of the display panel 101. An angle or an arc length between the first terminals 109 that are located next to each other is substantially the same as an angle or an arc length between the pads 106 that are located next to each other.

In one embodiment, the first periphery or side 112 of the flexible film 110 is formed to have the same curvature as the first terminal 109. In other words, the first periphery 112 of the flexible film 110 may have a curvature matching or corresponding to the external profile of the display region 107.

As such, the plurality of pads 106 and the first terminals 109 of the flexible film 110 are arranged along the external profile of the display region 107. The first periphery or side 112 of the flexible film 110 is also shaped according to the curvature of the external profile of the display region 107. Accordingly, even when the display apparatus 100 has a circular shape, matching the curvature of the pads 106, the first terminals 109, and the first periphery or side 112 of the flexible film 110 to the external profile of the display region 107 facilitates reducing the size of the non-display region 108 of the display apparatus 100.

Figure 4:
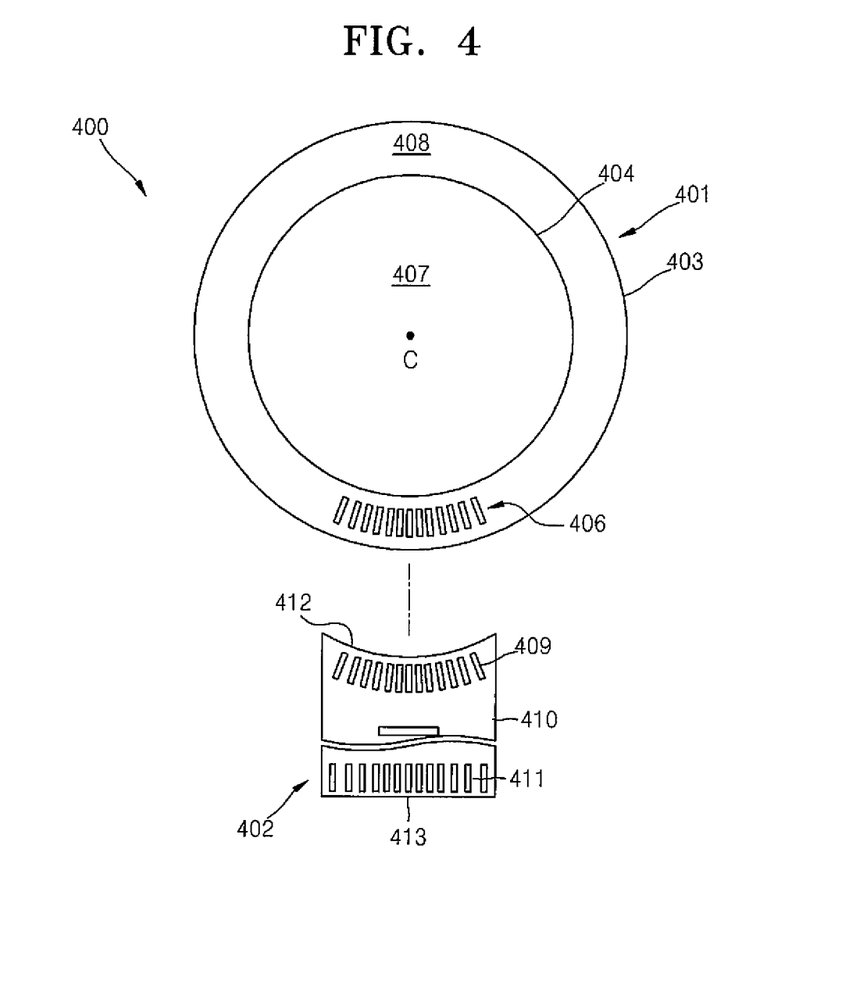
FIG. 4 is a plan view of a pad and a terminal of a circuit board of a display apparatus according to another embodiment of the present invention, before coupling the same.
Figure 5:
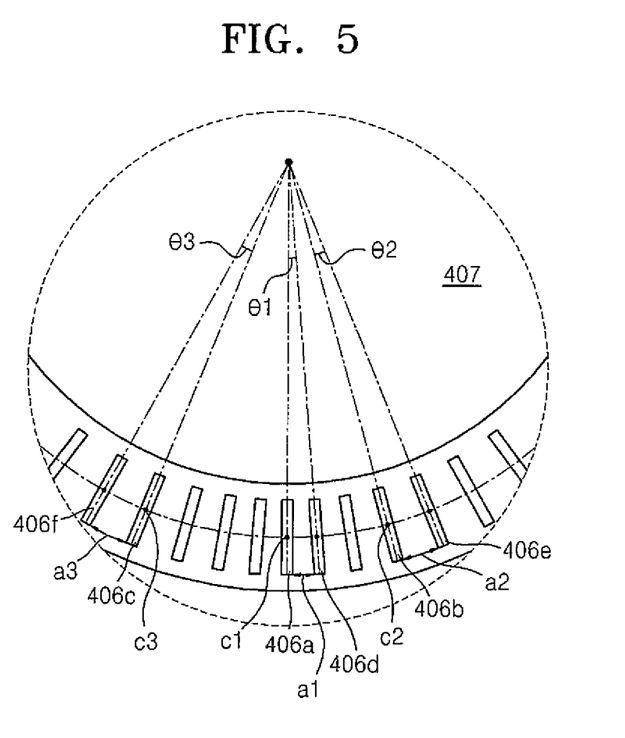
FIG. 5 is an enlarged plan view showing a portion in which a pad is formed in the display apparatus of FIG. 4.

FIG. 4 illustrates a pad 406 and a first terminal 409 of a circuit board 402 before coupling according to another embodiment of the present invention and FIG. 5 illustrates an enlarged portion of FIG. 4 in which the pad 406 of the display apparatus 400 is formed.

Referring to FIGS. 4 and 5, the display apparatus 400 includes a display panel 401 and a circuit board 402.

A substrate 403 is disposed on the display panel 401. The substrate 403 includes a display region 407 that displays images and a non-display region 408 that extends outwards from the display region 407 (e.g., the non-display region 408 extends around a periphery of the display region 407 of the substrate 403).

The pads 406 are arranged on the non-display region 408. The circuit board 402 is coupled to the pads 406. The circuit board 402 includes a flexible film 410, a first terminal 409 located at a first periphery or side 412 of the flexible film 410 and a second terminal 411 located at a second periphery or side 413 of the flexible film 410 opposite the first periphery or side 412 of the flexible film 410. The first terminal 409 on the first side 412 of the flexible film 410 is coupled to the pads 406 and the second terminal 411 on the second side 412 of the film is configured to be coupled to an external device.

The display panel 401 has a circular shape. The substrate 403 also has a circular shape. The display region 407 formed on the substrate 403 and the non-display region 408 that extends outward from or around the display region 407 each also have a circular shape. The display region 407 and the non-display region 408 may have the same radius of curvature.

The pads 406 are aligned separately from each other along an arc, which defines the first direction of the display panel 401. Also, central points of the pads 406 are located on at least two different locations along the first direction of the display panel 401 (e.g., central points of the pads 406 are defined at intersections between the arc direction and radial directions extending outward from a central point C of the display panel 401).

For example, a first pad 406a, which is located at the center among the plurality of pads 406, includes a first pad central point $c_1$. The first pad 406a central point $c_1$ is located along a direction (e.g., a radial direction) that crosses or intersects the first direction. The direction along which the first pad central point $c_1$ is located divides a length of the first pad 406a into two (e.g., the first pad 406a is symmetric about the radial direction along which the first pad central point $c_1$ is located).

Among the pads 406, a second pad 406b disposed on the right side of the first pad 406a and a third pad 406c disposed on the left side of the first pad 406a include a second pad central point $c_2$ and a third pad central point $c_3$, respectively. The second pad central point $c_2$ and the third pad central point c3 are located along directions (e.g., radial directions) that cross or intersect the first direction (e.g., the arc) and divide lengths of the second pad 406b and the third pad 406c into two.

In one embodiment, the first pad central point $c_1$, the second pad central point $c_2$, and the third pad central point $c_3$ are positioned at different locations along the arc direction. Central points of pads 406 other than the first pad central point $c_1$, the second pad central point $c_2$, and the third pad central point $c_3$ may be disposed at different locations.

Also, the pads 406 may be arranged along the external profile of the display region 407. A radius of curvature formed by the pads 406 may be substantially the same as the radius of curvature of the display region 407.

Unlike the embodiments of FIG. 1, the pads 406 are aligned at different angles relative to a central point C of the display panel 401.

For example, the first pad 406a located at the center of the pads 406 and a fourth pad 406d located next to the first pad 406a define a first angle $\theta_1$ therebetween relative to the central point C of the display panel 401. A length of a space between the first pad 406a and the second pad 406b is a first arc length $a_1$.

The second pad 406b located on the right side of the first pad 406a and a fifth pad 406e located next to the second pad 406b define a second angle $\theta_2$ therebetween relative to the central point C of the display panel 401. A length of a space between the second pad 406b and the fifth pad 406e is a second arc length a2.

The third pad 406c located on the left side of the first pad 406a and a sixth pad 406f located next to the third pad 406c define a third angle $\theta_3$ therebetween relative to the central point C of the display panel 401. A length of a space between the third pad 406c and the sixth pad 406f is a third arc length a3.

In one embodiment, the first angle $\theta_1$, the second angle $\theta_2$, and the third angle $\theta_3$ are different from each other. For instance, in one embodiment, an angle between the pads 406 that are located next to each other gradually increases from the center of the pads 406 to the periphery of the pads 406. In the present embodiment, the second angle $\theta_2$ is greater than the first angle $\theta 1$ and the third angle $\theta_3$ is greater than the second angle $\theta_2$.

Accordingly, an arc length between the pads 406 that are located next to each other increases from the center to the periphery of the pads 406. In the present embodiment, the second arc length $a_2$ is longer than the first arc length $a_1$, and the third arc length $a_3$ is longer than the second arc length $a_2$.

As such, an angle between the pads 406 that are located next to each other increases from the center to the periphery of the pads 406 and an arc length increases accordingly as well.

Additionally, the first terminals 409 that couple to the pads 406 have the same radius of curvature as the pads 406. The first terminals 409 are also oriented to match or correspond to the external profile of the display region 407.

When the first terminals 409 are coupled to the pads 406, the first terminals 409 are arranged along the arc direction of the display panel 401 and the central points of the first terminals 409 are positioned on at least two different locations along the arc (e.g., central points of the first terminals 409 are defined at intersections between the arc direction and radial directions extending outward from a central point C of the display panel 401).

The first terminals 409 are arranged at the same angular positions as the pads 406. An angle and an arc length between the first terminals 409 that are located next to each other are substantially the same as the angle and the arc length between the pads 406 that are located next to each other.

In one embodiment, the first periphery or side 412 of the flexible film 410 has the same radius of curvature as the first terminals 409. In other words, the first periphery or side 412 of the flexible film 410 is curved to match or correspond to the external profile of the display region 407.

Accordingly, positioning the pads 406 and the first terminals 409 along an arc facilitates reducing the size of the non-display region 108. Additionally, increasing the angles between adjacent pads 406 and between adjacent first terminals 409 from the center to the periphery of the pads 409 and the first terminals 409, respectively, is configured to reduce or eliminate the phenomenon of misalignment between the pads 406 and the first terminals 409 when the first terminals 409 are coupled to the pads 406.

Figure 6:
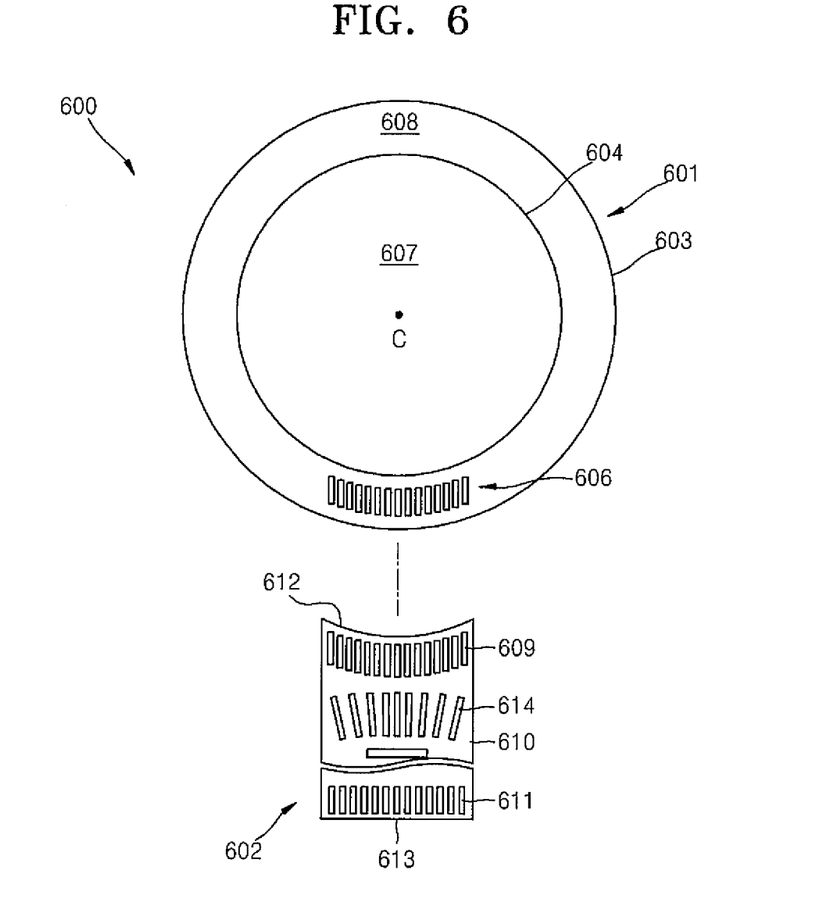
FIG. 6 is a plan view of a pad and a terminal of a circuit board of a display apparatus according to another embodiment of the present invention, before coupling the same.
Figure 7:
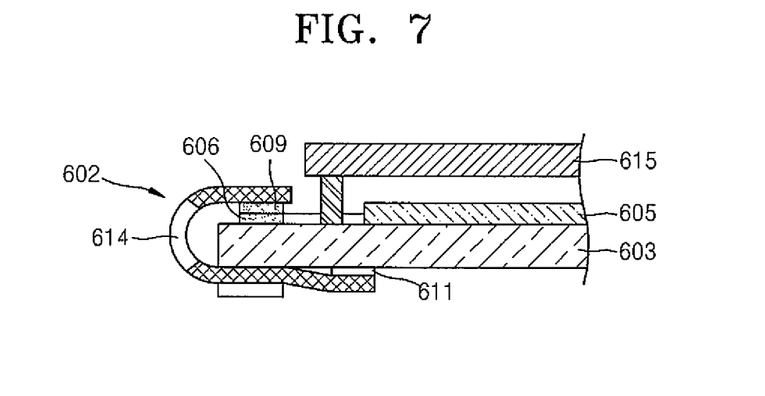
FIG. 7 is a cross-sectional view showing the circuit board of FIG. 6 wrapped around a substrate.

FIG. 6 illustrates pads 606 of a display apparatus 600 and first terminals 609 of a circuit board 602 according to another embodiment of the present invention before coupling the first terminals 609 to the pads 606. FIG. 7 illustrates the circuit board 602 wrapping around a portion of a substrate 603.

Referring to FIGS. 6 and 7, a display apparatus 600 includes a display panel 601 and the circuit board 602

The display panel 601 includes a substrate 603. The substrate 603 includes a display region 607 in which a display unit 605 is formed and a non-display region 608 that extends outwards from the display region 607 (e.g., the non-display region 608 extends around a periphery of the display region 607). A sealing portion 604 that covers the display unit 605 is formed on the substrate 603. In the present embodiment, the display panel 601, the display region 607, and the non-display region 608 each have a circular shape.

The circuit board 602 is electrically coupled to the pads 606. The circuit board 602 includes a flexible film 610, first terminals 609 located at a first periphery or side 612 of the flexible film 610, and second terminals 611 located at a second periphery or side 613 of the flexible film 610 opposite the first periphery or side 613 of the flexible film 610. The first terminals 609 are coupled to the pads 606 and the second terminals 611 are configured to be coupled to an external device.

The pads 606 are spaced apart from each other and arranged along an arc direction, which defines a first direction of the display panel 601. Central points of the pads 606 are disposed on at least two different locations along the arc direction (e.g., the first direction) of the display panel 601 (e.g., central points of the pads 606 are defined at intersections between the arc direction and radial directions extending outward from a central point C of the display panel 601).

The pads 606 are arranged along the external profile of the display region 607. A radius of curvature of the plurality of pads 606 is substantially the same as a radius of curvature of the display region 607. In one embodiment, angles defined between adjacent pads 606 relative to the central point C of the display panel 601 are the same.

Additionally, the first terminals 609 are formed to match or correspond to the external profile of the display region 607. A radius of curvature of the first terminals 609 is substantially the same as the radius of curvature of the pads 606.

In one embodiment, a plurality of slits 614 is formed on the circuit board 609.

The slits 614 are arranged along a folded portion of the flexible film 610 (e.g., the slits 614 are formed in a portion of the flexible film 610 that is configured to fold around a portion of the substrate 603, as illustrated in FIG. 7). The slits 614 are formed between the first terminals 609 and the second terminals 612. A length of each of the slits 614 extends along a folding direction of the flexible film 610. In the present embodiment, the slits 614 are strip-shaped or rectangular grooves oriented lengthwise along a length direction of the flexible film 610. The slits 614 are separated from each other by portions of the flexible film 610 in a direction transverse to the folding direction of the flexible film 610.

The plurality of slits 614 formed in the flexible film 610 facilitates more easily folding or wrapping the circuit board 609 around a portion of the substrate 603. In other words, after coupling the first terminals 609 to the pads 606, the circuit board 609 is folded such that the circuit board 609 wraps around a portion of the substrate 603. The slits 614 are formed at a folded portion of the flexible film 610 such that foldability of the circuit board 609 increases.

Figure 8:
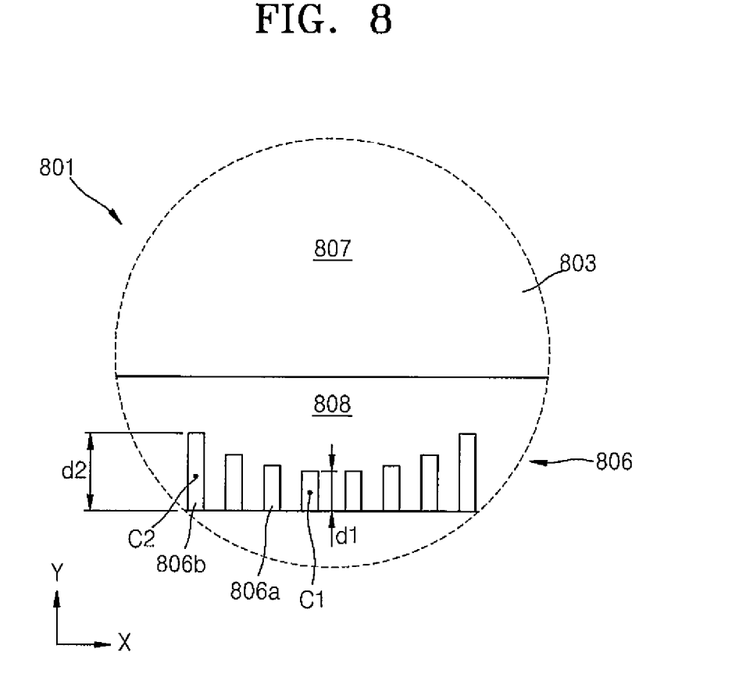
FIG. 8 is an enlarged plan view showing a portion in which a pad is formed in a display apparatus according to another embodiment of the present invention.

FIG. 8 is an enlarged view of a portion of a display device in which pads 806 of a display panel 801 are formed according to another embodiment of the present invention.

Referring to FIG. 8, the display panel 801 includes a substrate 803. The substrate 803 includes a display region 807 and a non-display region 808 that extends outward from and around a periphery of the display region 807. The pads 806 are arranged on the non-display region 808.

In one embodiment, the pads 806 are spaced apart from each other along a first direction (e.g., the X direction) of the display panel 801. In the illustrated embodiment the pads 806 are equally spaced along the first direction, although in an alternate embodiment the pads 806 may not be equally spaced.

Central points of the pads 806 are located at at least two different locations along a second direction (e.g., the Y direction) that crosses the first direction (X direction).

For example, the pads 806 include a plurality of first pads 806a that are spaced apart from each other and arranged along the first direction (e.g., the x-direction) and second pads 806b located at the outermost periphery of the pads 806.

The first pads 806a are pads that apply electrical signals to a device of a display unit (e.g., an OLED) to display images on the display panel 801 and the second pads 806b are on/off pads for a lighting test of the display panel 801. The lighting test of the display panel 801 may be performed to ensure against faulty operation of the display panel 801.

A length $d_2$ of the second pads 806b is longer than a length $d_1$ of the first pads 806a along the second direction (e.g., the y-direction). In the present embodiment, the first pads 806a and the second pads 806b both have a rectangular shape, but they are not limited thereto.

The first pad 806a has a first pad central point $c_1$ in the second direction (e.g., the y-direction). A line extending along the second direction (e.g., the y-direction) and through the first pad central point $c_1$ divides the length of the first pads 806a into two.

The second pads 806b have second pad central points $c_2$ in the second direction (e.g., the y-direction). Lines extending along the second direction (e.g., the y-direction) and through the second pad central points $c_2$ divide the length of the second pads 806b into two.

Since the length of the first pad 806a and the length of the second pad 806b are different, the first pad central point $c_1$ and the second pad central point $c_2$ are formed at different locations along the second direction.

Accordingly, the first pads 806a and the second pads 806b may have different functions. The first pads 806a and the second pads 806b may be coupled to a circuit board (not shown) to apply electrical signals to the first pads 806a and the second pads 806b.

Figure 9:
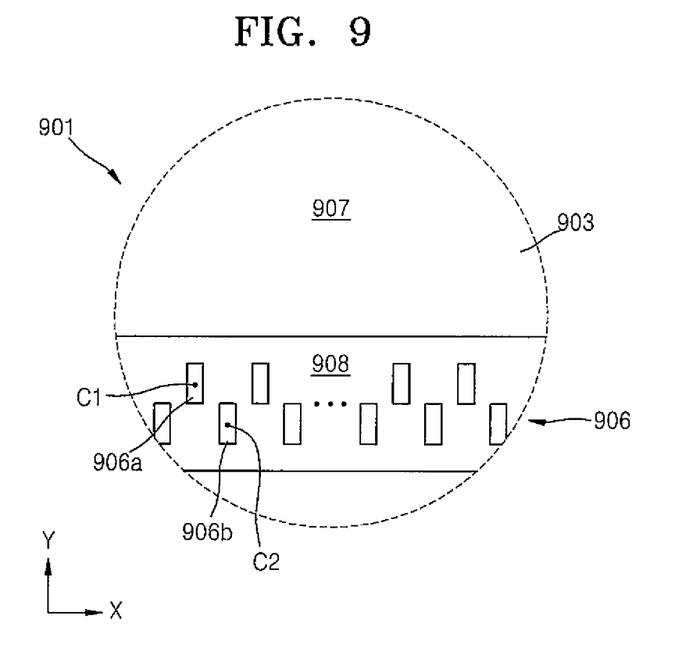
FIG. 9 is an enlarged plan view showing a portion in which a pad is formed in a display apparatus according to another embodiment of the present invention.

FIG. 9 is an enlarged view of a portion of a display device in which pads 906 of a display panel 901 according to another embodiment of the present invention are formed.

Referring to FIG. 9, the display panel 901 includes a substrate 903. The substrate 903 includes a display region 907 and a non-display region 908 that extends outward from and around a periphery of the display region 907. The pads 906 are arranged on the non-display region 908.

In one embodiment, the pads 906 are separated from each other along a first direction (e.g., the X direction) of the display panel 901. In the illustrated embodiment, the pads 906 are equally spaced along the first direction, although in an alternate embodiment the pads 906 may not be equally spaced.

In one embodiment, central points of the pads 906 are located at at least two different locations along a second direction (e.g., the Y direction) that crosses the first direction (X direction).

For example, the pads 906 include first pads 906a that are spaced from each other and arranged along the first direction and second pads 906b located at the outermost periphery of the pads 906.

For example, the pads 906 include first pads 906a that are spaced from each other along a first line extending in the first direction and second pads 906b spaced from each other along a second line extending in the first direction. The first pads 906a and the second pads 906b are alternately aligned. In the present embodiment, the first pads 906a and the second pads 906b are aligned in a zigzag or staggered manner.

The first pads 906a have first pad central points $c_1$ in the second direction (e.g., the y-direction). A line extending along the second direction (e.g., the y-direction) and through the first pad central point $c_1$ divides a length of the first pad 906a into two.

The second pads 906b have second pad central points $c_2$ in the second direction (e.g., the y-direction). A line extending along the second direction (e.g., the y-direction) and through the second pad central point $c_2$ divides a length of the second pads 906b into two.

As such, the first pad central point $c_1$ and the second pad central point $c_2$ are defined at different locations along the second direction and thus the pads 906 and the circuit board (not shown) may be easily coupled.

Figure 10:
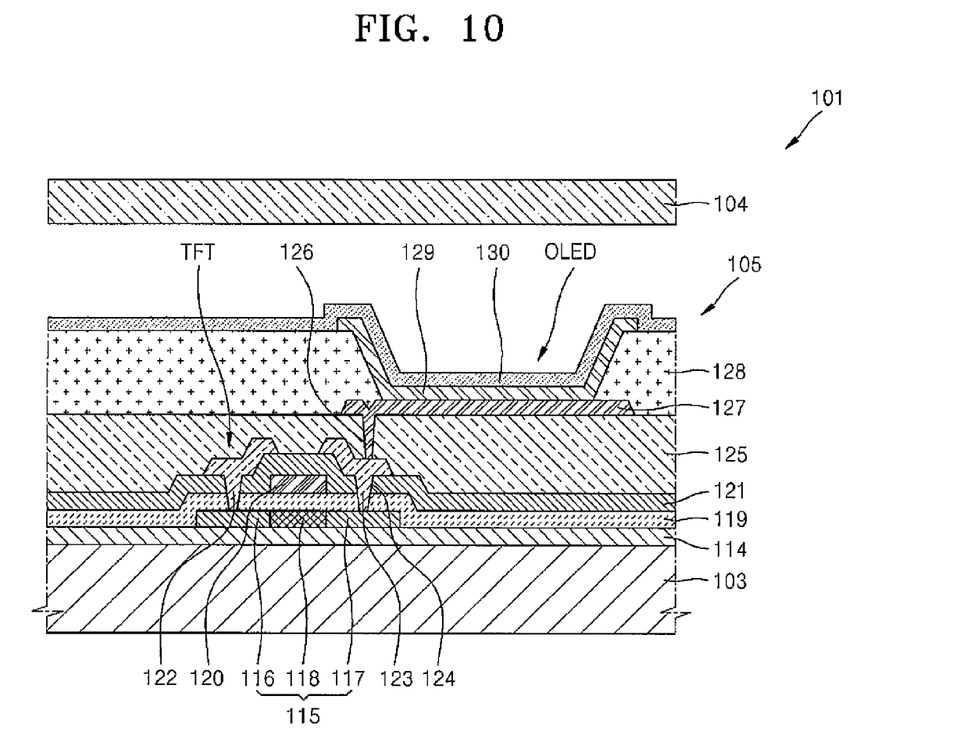
FIG. 10 is a cross-sectional view showing a sub-pixel of the display apparatus shown in FIG. 1.
Figure 11:
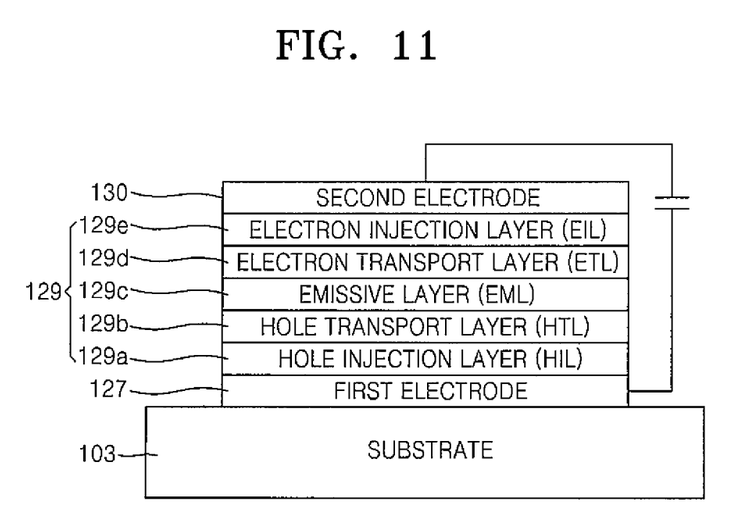
FIG. 11 is a schematic view showing a structure of an organic light-emitting device in FIG. 10.

FIG. 10 is a cross-sectional view showing a sub-pixel of the display panel shown in FIG. 1 and FIG. 11 is a view showing the organic light-emitting device in FIG. 10.

Referring to FIGS. 10 and 11, the display panel 101 includes a substrate 103, a display unit 105 formed on the substrate 103 to show images, and a sealing portion 104 that covers the display unit 105.

The substrate 103 may include glass having rigidity or a polymer having flexibility. The sealing portion 104 may be a film including glass, a substrate including a polymer, or a film having flexibility. Also, the sealing portion 104 may include an organic film and an inorganic film that are alternately layered.

A barrier layer 114 is formed on the substrate 103. The barrier layer 114 includes a structure in which an organic film, an inorganic film, or an organic film and an inorganic film are layered (e.g., alternately layered organic and inorganic films). The barrier layer 114 blocks oxygen or moisture from penetrating into an organic light-emitting device (OLED).

A thin film transistor (TFT) is formed on the barrier layer 114. The present embodiment illustrates a top gate TFT, but the TFT may have any other structure, such as a bottom gate structure.

A semiconductor active layer 115 is formed on the barrier layer 114. The semiconductor active layer 115 may be formed of a polycrystalline silicon, but the semiconductor active layer 115 is not limited thereto, and may be formed of an oxide semiconductor.

For example, the oxide semiconductor may include an oxide of any material selected from metal elements belonging to Groups 12, 13, and 14, such as zinc (Zn), indium (In), gallium (Ga), tin (Sn), cadmium (Cd), germanium (Ge), and hafnium (Hf).

The semiconductor active layer 115 includes a source region 116 and/or a drain region 117 formed by doping N-type impurity ions or P-type impurity ions. A region between the source region 116 and the drain region 117 is a channel region 118 in which impurity ions are not doped.

A gate insulating layer 119 is formed on the semiconductor active layer 115. The gate insulating layer 119 includes an inorganic layer such as a silicon oxide, a silicon nitride, and a metal oxide, which may be formed as a single layer structure or a multi-layer structure.

A gate electrode 120 is formed on the gate insulating layer 119. The gate electrode 120 may include a single layer or a multi-layer of gold (Au), silver (Ag), copper (Cu), nitrogen (Ni), platinum (Pt), palladium (Pd), aluminum (Al), molybdenum (Mo), chromium (Cr), or an alloy such as Al:Nd or Mo:W.

An interlayer insulating layer 121 is formed on the gate electrode 120. The interlayer insulating layer 121 is formed of an inorganic material such as a silicon oxide and a silicon nitride. The interlayer insulating layer 121 may include an organic material.

A source electrode 122 and a drain electrode 123 are formed on the interlayer insulating layer 121. A contact hole 124 is formed in the gate insulating layer 119 and the interlayer insulating layer 121 due to a selective removal of a portion of the gate insulating layer 119 and the interlayer insulating layer 121. The source electrode 122 is electrically coupled to the source region 116 via the contact hole 124, and the drain electrode 123 is electrically coupled to the drain region 117 via the contact hole 124.

A protective layer (e.g., a passivation layer and/or a planarization layer 125) is formed on the source electrode 122 and the drain electrode 123. The protective layer 125 protects and planarizes a bottom TFT. The protective layer 125 may have various compositions, for example, an organic material such as benzocyclobutene (BCB) and acryl or an inorganic material such as SiNx. The protective layer 125 may be formed as a single layer or a multi-layer structure.

In one embodiment, an OLED is formed on the TFT.

To manufacture the OLED, a first electrode 127 located opposite to a pixel electrode is electrically coupled to either the source electrode 122 or the drain electrode 123 via a contact hole 126 in the protective layer 125.

The first electrode 127 acts as an anode among the electrodes in the OLED, which may be formed of various conductive materials. The first electrode 127 may be formed as a transparent electrode or a reflective electrode depending on the purpose thereof.

For example, when the first electrode 127 is used as a transparent electrode, the first electrode 127 may include ITO, IZO, ZnO, and $In_2O_3$, and when the first electrode 127 is used as a reflective electrode, a reflective layer may include a compound such as silver (Ag), magnesium (Mg), aluminum (Al), Pt, Pd, Au, nickel (Ni), neodymium (Nd), iridium (Ir), chromium (Cr), or a combination thereof. ITO, IZO, ZnO, and $In_2O_3$ may be formed on the reflective layer.

A pixel defining layer (PDL) 128 is formed on the protective layer 125 to cover a periphery of the first electrode 127 of the OLED. The pixel defining layer 128 defines a light-emitting region of each sub-pixel.

The pixel defining layer 128 is formed of an organic material or an inorganic material.

For example, the pixel defining layer 128 may be formed of an organic material such as polyimide, polyamide, benzocyclobutene, acryl resin, and phenol resin or an inorganic material such as SiNx. The pixel defining layer 128 may have various structures, such as a single layer structure or a multi-layer structure.

An intermediate layer 129 may be formed on a portion of the first electrode 127 that is exposed due to etching a portion of the pixel defining layer 128 (e.g., a portion of the pixel defining layer 128 covering the first electrode 127 may be etched away such that the intermediate layer 129 may be formed on an exposed portion of the first electrode 127). The intermediate layer 129 may be formed by a deposition process.

In the present embodiment, the intermediate layer 129 is illustrated to correspond only to each subpixel, that is, to a patterned first electrode 127, but this is only for a convenient illustration of describing features of the subpixel, and various embodiments thereof are possible.

The intermediate layer 129 may include a low molecular weight organic material or a polymer organic material.

For example, as illustrated in FIG. 11, the intermediate layer 129 includes an emissive layer (EML) 129c and may further include any one of a hole injection layer (HIL) 129a, a hole transport layer (HTL) 129b, an electron transport layer (ETL) 129d, and an electron injection layer (EIL) 129e. However, the present embodiments are not limited thereto, and, for example, the intermediate layer 129 may include an EML and further include various other functional layers.

Referring back to FIG. 10, a second electrode 130, which corresponds to a common electrode of an OLED, is formed on the intermediate layer 129. The second electrode 130 may also be formed as a transparent electrode or a reflective electrode, as in the case of the first electrode 127.

The first electrode 127 and the second electrode 130 are insulated from each other by the intermediate layer 129. When voltage is applied to the first electrode 127 and the second electrode 130, visible light may be emitted from the intermediate layer 129 to display an image that may be recognized by a user.

The second electrode 130 may be formed as a transparent electrode or a reflective electrode, as in the case of the first electrode 127.

When the second electrode 130 is used as a transparent electrode, a metal having a low work function, for example, Li, Ca, LiF/Ca, LiF/Al, Al, Mg or a compound thereof is deposited on the intermediate layer 129. An auxiliary electrode formed of a material for forming a transparent electrode such as ITO, IZO, ZnO, and $In_2O_3$ may be further deposited thereon.

When the second electrode 130 is used as a reflective electrode, Li, Ca, LiF/Ca, LiF/Al, Al, Mg, and a compound thereof are top deposited.

Additionally, when the first electrode 127 is formed as a transparent electrode or a reflective electrode, the first electrode 127 may be formed to have a shape that corresponds to an opening of each subpixel. The second electrode 130 may be formed by top deposition of the transparent electrode or the reflective electrode on the entire display region.

Alternatively, the second electrode 130 may have various patterns instead of the entire display region. The first electrode 127 and the second electrode 130 may be layered.

The sealing portion 104 is bonded to the OLED. The sealing portion 104 is formed to protect the OLED or other layers from external moisture or oxygen.

The sealing portion 104 may be glass having rigidity, a polymer resin, or a film having flexibility. Also, the sealing portion 104 may have an organic layer and an inorganic layer alternately layered on the OLED. In one embodiment, there may be a plurality of the organic layers and the inorganic layers.

For example, the sealing portion 104 may have a structure in which at least one organic layer such as epoxy, polyimide, polyethylene terephthalate, polycarbonate, polyethylene, and polyacrylate and at least one inorganic layer such as silicon oxide ($SiO_2$), silicon nitride ($SiN_x$), aluminum oxide (Al$_2$O$_3$), titanium oxide (TiO$_2$), zirconium oxide (ZrO$_x$), zinc oxide (ZnO) are layered.

As described above, according to the one or more of the above embodiments of the present invention, a display apparatus according to an embodiment of the present invention has a thorough connection between a pad and a terminal of a circuit board to optimize space of the connection.

It should be understood that the exemplary embodiments described therein should be considered in a descriptive sense only and not for purposes of limitation. Descriptions of features or aspects within each embodiment should typically be considered as available for other similar features or aspects in other embodiments.

While one or more embodiments of the present invention have been described with reference to the figures, it will be understood by those of ordinary skill in the art that various changes in form and details may be made therein without departing from the spirit and scope of the present invention as defined by the following claims and their equivalents.

What is claimed is:

1. A display apparatus comprises:
    a display panel having a circular shape comprising a substrate comprising a display region in which a display unit is located, a non-display region that extends outward from the display region and in which a plurality of pads are located, and a sealing portion that covers the display unit; and
    a circuit board comprising a flexible film and a plurality of terminals on the flexible film that are electrically coupled to the plurality of pads, wherein
    the plurality of pads are spaced from each other along a first direction of the display panel, wherein pad central points of the plurality of pads are at at least two different locations along the first direction, and wherein the first direction is an arc corresponding to the circular shape of the display panel.

2. The display apparatus of claim 1, wherein at least a portion of the display panel is curved.

3. The display apparatus of claim 1, wherein a line extending through the pad central point of each of the pads divides a length of the each of the pads into two.

4. The display apparatus of claim 1, wherein a terminal of the circuit board coupled to the plurality of pads has a shape corresponding to a shape of the plurality of pads.

5. The display apparatus of claim 4, wherein a radius of curvature defined by the plurality of pads is the same as a radius of curvature defined by the display region.

6. The display apparatus of claim 4, wherein angles between adjacent ones of the pads are the same.

7. The display apparatus of claim 4, wherein lengths of arcs between adjacent ones of the pads are the same.

8. The display apparatus of claim 4, wherein an angle between adjacent ones of the terminals is the same as an angle between adjacent ones of the pads.

9. The display apparatus of claim 4, wherein an edge of the flexible film has a curvature corresponding to the external profile of the display region.

10. The display apparatus of claim 4, wherein angles between adjacent ones of the pads vary across the plurality of pads.

11. The display apparatus of claim 10, wherein an angle between adjacent ones of the pads increases gradually from a center of the plurality of pads to a periphery of the plurality of pads.

12. The display apparatus of claim 11, wherein an arc length between adjacent ones of the pads of the plurality of pads increases gradually from the center of the plurality of pads to the periphery of the plurality of pads.

13. The display apparatus of claim 1, wherein the flexible film is folded around a portion of the substrate and a plurality of slits are defined along a portion of the flexible film at which the flexible film is folded.

14. The display apparatus of claim 13, wherein the slits are spaced from each other along a direction transverse to a direction in which the flexible film is folded.

15. The display apparatus of claim 1, wherein the plurality of pads comprises at least one first pad arranged along the first direction of the display panel and at least one second pad at an outermost portion of the plurality of pads, and wherein a size of the second pad is greater than a size of the first pad.

16. The display apparatus of claim 15, wherein the first pad and the second pad are spaced from each other along the first direction of the display panel, and wherein a central point of the first pad and a central point of the second pad are at different locations along the first direction.

17. A display apparatus comprises:
    a display panel comprising a substrate comprising a display region in which a display unit is located, a non-display region that extends outward from the display region and in which a plurality of pads are located, and a sealing portion that covers the display unit; and
    a circuit board comprising a flexible film and a plurality of terminals on the flexible film that are electrically coupled to the plurality of pads, wherein
    a plurality of first pads of the plurality of pads are spaced from each other along a first line and pad central points of the plurality of first pads are at at least two different locations along the first line,
    a plurality of second pads of the plurality of pads are spaced from each other along a second line parallel to the first line and pad central points of the plurality of second pads are at at least two different locations along the second line, and
    the plurality of first pads are staggered relative to the plurality of second pads.

* * * * *